(12) United States Patent
Zmuidzinas et al.

(10) Patent No.: US 8,878,626 B2
(45) Date of Patent: Nov. 4, 2014

(54) DISPERSION-ENGINEERED TRAVELING WAVE KINETIC INDUCTANCE PARAMETRIC AMPLIFIER

(75) Inventors: Jonas Zmuidzinas, Pasadena, CA (US); Peter K. Day, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 795 days.

(21) Appl. No.: 13/277,214

(22) Filed: Oct. 20, 2011

(65) Prior Publication Data

US 2012/0098594 A1    Apr. 26, 2012

Related U.S. Application Data

(60) Provisional application No. 61/394,848, filed on Oct. 20, 2010.

(51) Int. Cl.
*H03F 7/00* (2006.01)
*H03F 19/00* (2006.01)
*H03F 7/02* (2006.01)

(52) U.S. Cl.
CPC ........................................ *H03F 7/02* (2013.01)
USPC .......................................... 333/99 S; 330/4.6

(58) Field of Classification Search
CPC ...... G02F 2001/392; H03F 19/00; H03F 7/02
USPC .................... 333/99 S; 330/4.5–4.7; 359/333
See application file for complete search history.

(56) References Cited

U.S. PATENT DOCUMENTS

| | | | |
|---|---|---|---|
| 4,132,956 A * | 1/1979 | Russer | 330/5 |
| 7,042,635 B2 * | 5/2006 | Legrand et al. | 359/341.41 |
| 7,388,710 B2 * | 6/2008 | Ono et al. | 359/330 |
| 8,415,951 B2 * | 4/2013 | Vester | 324/316 |

* cited by examiner

*Primary Examiner* — Dean O Takaoka
*Assistant Examiner* — Alan Wong
(74) *Attorney, Agent, or Firm* — Milstein Zhang & Wu LLC; Joseph B. Milstein

(57) ABSTRACT

A traveling wave kinetic inductance parametric amplifier comprises a superconducting transmission line and a dispersion control element. The transmission line can include periodic variations of its dimension along its length. The superconducting material can include a high normal state resistivity material. In some instances the high normal state resistivity material includes nitrogen and a metal selected from the group consisting of titanium, niobium and vanadium. The traveling wave kinetic inductance parametric amplifier is expected to exhibit a noise temperature below 100 mK/GHz.

12 Claims, 11 Drawing Sheets

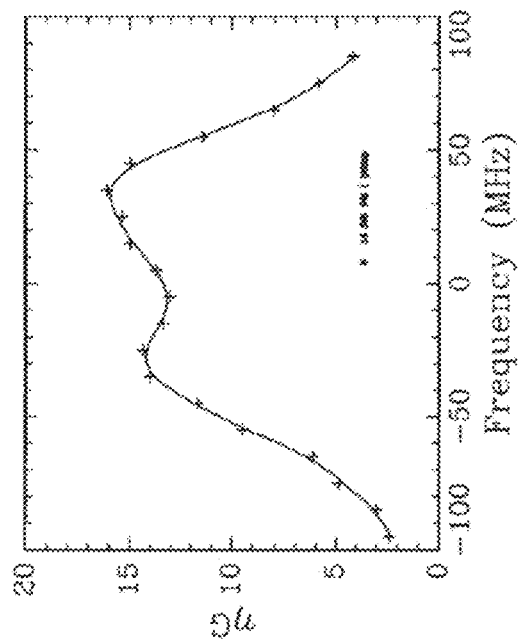
PRIOR ART
FIG. 1C
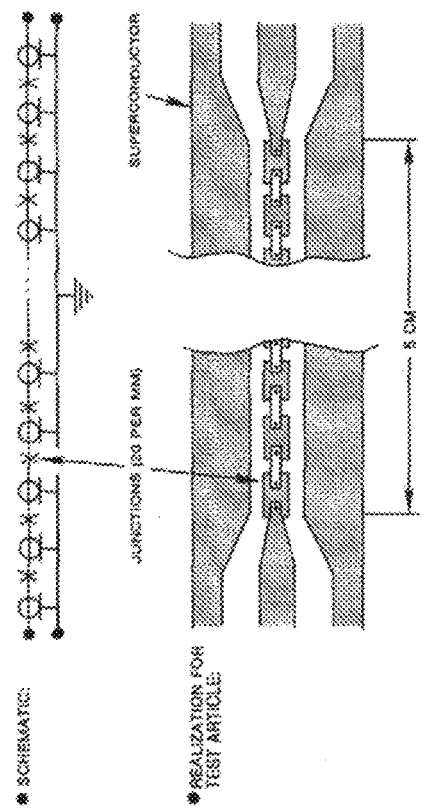
PRIOR ART
FIG. 1A
PRIOR ART
FIG. 1B

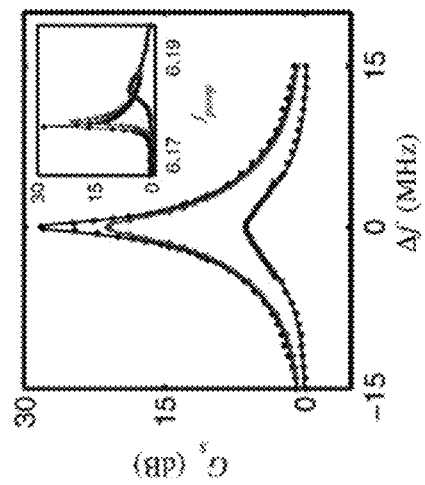
FIG. 2A PRIOR ART
FIG. 2B PRIOR ART
FIG. 2C PRIOR ART
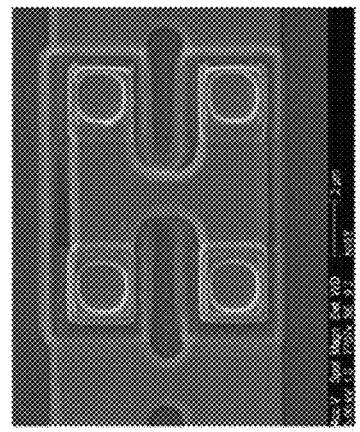
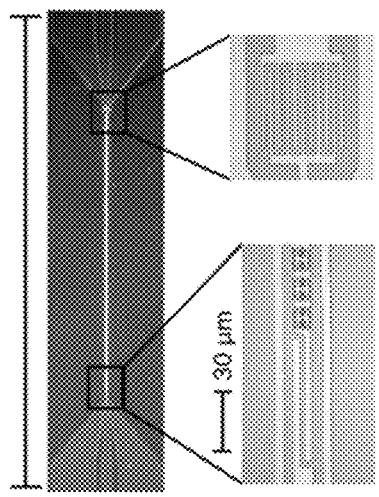
FIG. 2D PRIOR ART  FIG. 2E PRIOR ART

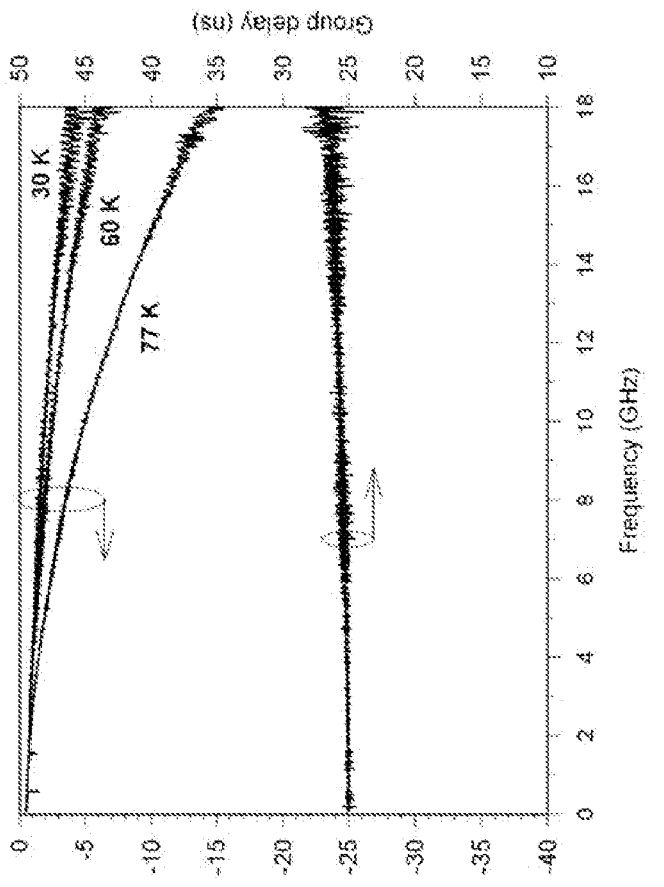
FIG. 5D
FIG. 5A  FIG. 5B
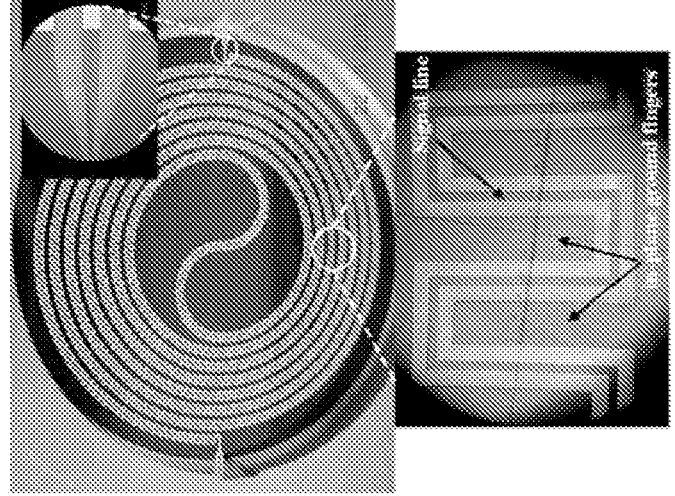
FIG. 5C

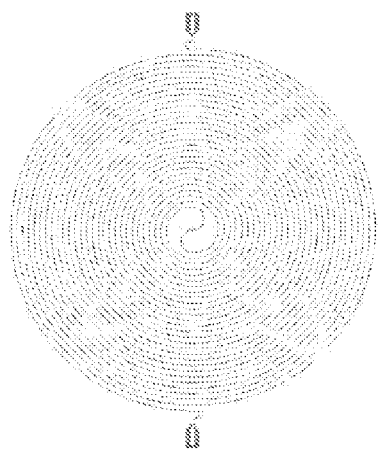
FIG. 6A
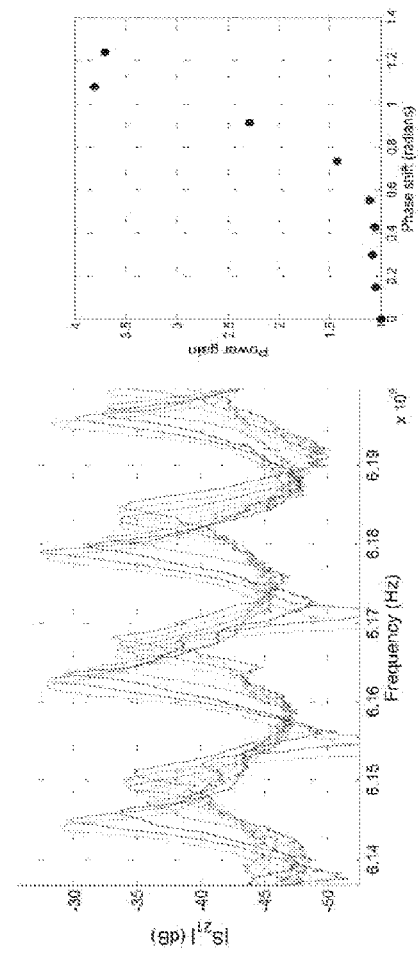
FIG. 6C
FIG. 6B

Lumped-element high-pass filter

Coplanar waveguide high-pass filter

FIG. 9A       FIG. 9B
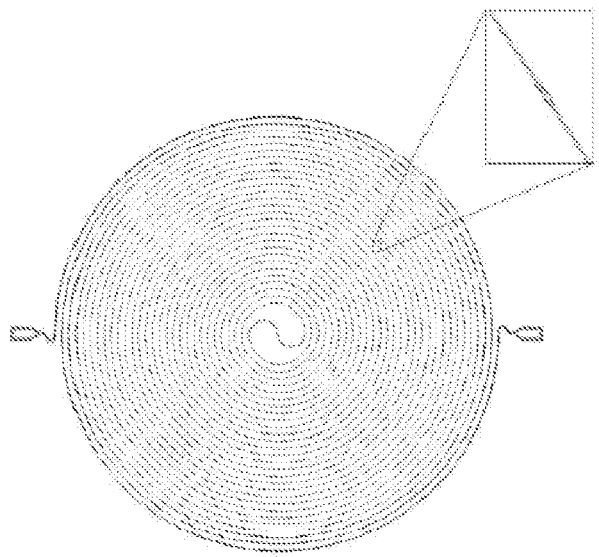
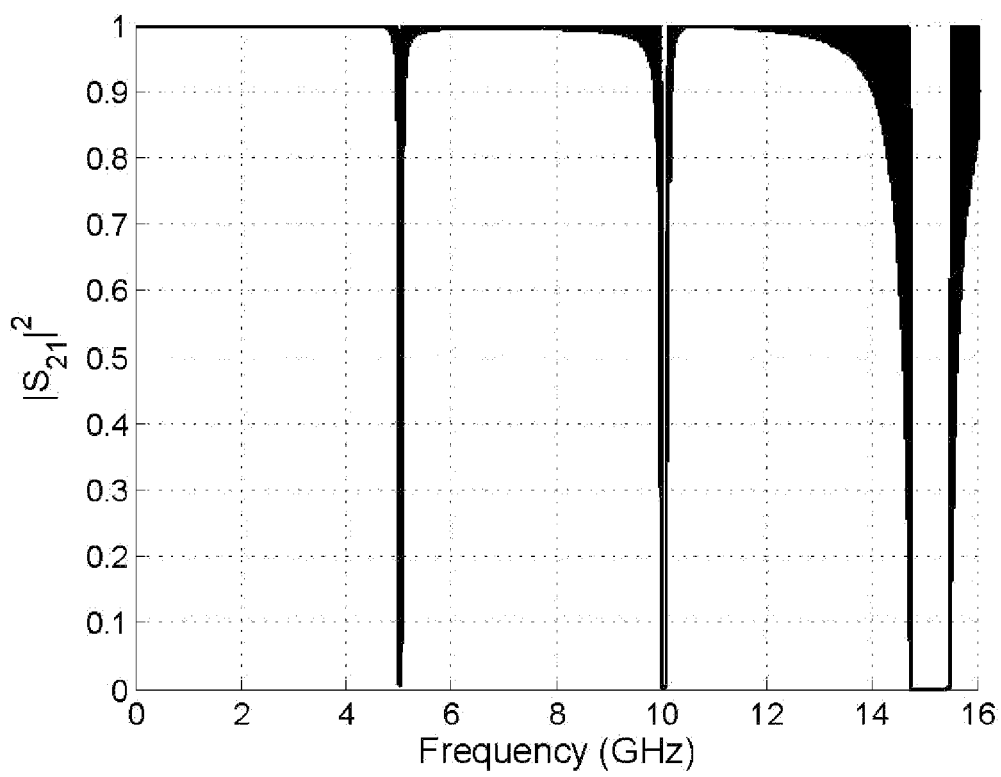
FIG. 9C

DISPERSION-ENGINEERED TRAVELING WAVE KINETIC INDUCTANCE PARAMETRIC AMPLIFIER

CROSS-REFERENCE TO RELATED APPLICATIONS

This application claims priority to and the benefit of U.S. provisional patent application Ser. No. 61/394,848 filed Oct. 20, 2010, which application is incorporated herein by reference in its entirety.

STATEMENT REGARDING FEDERALLY FUNDED RESEARCH OR DEVELOPMENT

This invention was made with government support under NNX10AC83G awarded by NASA. The government has certain rights in the invention.

FIELD OF THE INVENTION

The invention relates to traveling-wave parametric amplifiers.

BACKGROUND OF THE INVENTION

Traveling-wave parametric amplifiers, first proposed in the late 1950s, rely on the use of a low-loss nonlinear material. Although originally envisioned as electrical amplifiers operating at radio or microwave frequencies, the traveling-wave parametric amplifier concept was later adapted for use at optical frequencies and versions using optical fibers have now been successfully demonstrated. Relevant descriptions of those technologies include A. L. Cullen. A travelling-wave parametric amplifier. Nature, 181:332, 1958; P. K. Tien. Parametric Amplification and Frequency Mixing in Propagating Circuits. Journal of Applied Physics, 29:1347-1357, September 1958; A. L. Cullen. Theory of the travelling-wave parametric amplifier. Proc. IEE—Part B, 107(32):101-107, 1960; J. Hansryd and P. A. Andrekson. Broad-band continuous-wave-pumped fiber optical parametric amplifier with 49-dB gain and wavelength-conversion efficiency. IEEE Photonics Technology Letters, 13:194-196, March 2001; and J Hansryd, P A Andrekson, M Westlund, J Li, and PO Hedekvist. Fiber-based optical parametric amplifiers and their applications. IEEE J. Sel. Top. Quantum Electron., 8(3):506-520, 2002.

The use of the nonlinear response of a physical system to obtain oscillation or amplification has a long history. See for example, W. W. Mumford. Some notes on the history of parametric transducers. Proc. IRE, 48:848-853, May 1960. In the 1950s, the development of low-loss diodes with voltage-variable capacitance—varactors—stimulated a resurgence of interest in such effects and allowed the construction of low noise amplifiers operating in the microwave to millimeter-wave bands. See for example, L. S. Nergaard. Nonlinear-capacitance amplifiers. RCA Review, pages 3-17, March 1959. These devices are known as parametric amplifiers, because one of the circuit parameters (the capacitance in this case) is made to vary periodically through the application of a strong "pump" voltage waveform at frequency $f_P$. If a weak signal waveform at frequency $f_S$ is also applied to the circuit, under proper conditions the time-varying capacitance may transfer power from the pump frequency to the signal frequency, thereby achieving amplification. The pump frequency may either be around the signal frequency or around twice the signal frequency depending on the type of nonlinearity. Parametric amplification also involves generation of a third frequency, the "idler" $f_I$. The three frequencies are related by $f_S + f_I = f_P$ or $f_S + f_I = 2f_P$, depending on the type of nonlinearity. The special case $f_S = f_I$ is called the "degenerate mode"; otherwise the amplifier is said to be "non-degenerate".

Because the amplification mechanism relies on a nonlinear reactance, the device need not produce thermal noise or shot noise, and by the early 1960s it was understood that in principle, the noise performance is limited only by quantum mechanics. See, for example, W. H. Louisell, A. Yariv, and A. E. Siegman. Quantum Fluctuations and Noise in Parametric Processes. I. Physical Review, 124:1646-1654, December 1961. In practice, varactor diodes are not ideal and do produce some excess noise, but nevertheless excellent noise performance can be obtained. Due to their low noise, diode-based parametric amplifiers played a key role in the development of satellite communication and radio astronomy before they were replaced by cryogenic transistor amplifiers. Relevant descriptions include S. Weinreb, M. Balister, S. Maas, and P. J. Napier, Multiband low-noise receivers for a very large array. IEEE Transactions on Microwave Theory Techniques, 25:243-248, April 1977; Sander Weinreb, Tests of cooled 5 GHz parametric and GASFET amplifiers. Electronics Division Internal Report 203, National Radio Astronomy Observatory, Charlottesville, Va., 1980; M. E. Hines. The Virtues of Nonlinearity—Detection, Frequency Conversion, Parametric Amplification and Harmonic Generation. IEEE Transactions on Microwave Theory Techniques, 32:1097-1104, September 1984; and J. J. Whelehan, Low-noise amplifiers-then and now. IEEE Transactions on Microwave Theory Techniques, 50:806-813, March 2002. Today, cryogenic amplifiers using both high electron mobility transistors (HEMT) and bipolar silicon-germanium (SiGe) transistors offer excellent performance in the microwave band, with noise temperatures dropping below 1 K/GHz. However, this noise performance is still a factor of ~20 above the quantum mechanical limit $h\nu/k_B \approx 48$ mK/GHz, and is inadequate for some demanding applications. Indeed, there is currently great interest in the topic of quantum-limited amplification and measurement, particularly at microwave frequencies. See, for example, A. A. Clerk, M. H. Devoret, S. M. Girvin, F. Marquardt, and R. J. Schoelkopf. Introduction to quantum noise, measurement, and amplification. Reviews of Modern Physics, 82:1155-1208, April 2010.

Traveling-Wave Parametric Amplifiers

In order to deal with the capacitive reactance of the varactor diodes, early parametric amplifiers used single diodes in tuned circuits and consequently had fairly narrow bandwidths. The desire to increase the bandwidth led to the idea of the traveling-wave parametric amplifier, patented by Tien (U.S. Pat. No. 3,012,203), in which the nonlinear devices were placed periodically along the length of a distributed structure. If properly designed, interactions between the pump and signal waves propagating along this structure could lead to amplification of the signal. However, Landauer (R. Landauer, Parametric Amplification along Nonlinear Transmission Lines. Journal of Applied Physics, 31:479-484, March 1960, and R. Landauer, Shock waves in nonlinear transmission lines and their effect on parametric amplification. IBM J. Res. Dev., 4(4):391-401, 1960.) realized that the conditions required for parametric amplification in a traveling-wave structure would also, in general, lead to the development of shock fronts in the pump waveform. Landauer argued that traveling-wave amplifiers would be crippled by this effect: shock wave formation would prevent the amplifiers from achieving the desired combination of high gain with low noise.

Judging from the literature, Landauer's work appears to have substantially dampened the enthusiasm for traveling-wave parametric amplifiers operating at microwave frequencies in the subsequent decades. However, by the early 1960s the invention of the laser had raised the intriguing possibility of achieving parametric amplification and oscillation at optical wavelengths, and the traveling-wave theory developed by Tien for electrical amplifiers was adapted for the optical case. See, for example, R. H. Kingston, Parametric amplification and oscillation at optical frequencies. Proc. IRE, 50:472, 1962; and N. M. Kroll, Parametric Amplification in Spatially Extended Media and Application to the Design of Tuneable Oscillators at Optical Frequencies. Physical Review, 127: 1207-1211, August 1962. The use of an optical fiber to confine the light is very helpful for maximizing the power density and field strength for a fixed optical power, and this enhances the nonlinear effects required for parametric amplification. The idea of using an optical fiber for optical traveling wave parametric devices was described in a 1967 patent awarded to Garwin, Hardy, and Landauer (U.S. Pat. No. 3,297,875). Apparently, at this point Landauer understood that the significant dispersion (the wavelength-dependent phase velocity) of optical fibers would render moot his previous shock-wave objections to traveling-wave amplifiers. However, optical fiber parametric amplifiers did not receive much attention for decades, until 2001 when Hansryd and Andrekson demonstrated experimentally that, by using the dispersive characteristics of the fiber to advantage, very high gain was in fact possible in a fiber parametric amplifier.

Superconducting Parametric Amplifiers

The fact that superconductors exhibit nonlinear behavior at microwave frequencies was already known in 1950. See, for example, A. B. Pippard, Field variation of the superconducting penetration depth. Proc. Roy. Soc. A, 203(1073):210-223, 1950; and A. B. Pippard. An experimental and theoretical study of the relation between magnetic field and current in a superconductor. Proc. Roy. Soc. A, 216(1127):547-568, 1953. The development of a microscopic theory of superconductivity by Bardeen, Cooper and Schrieffer in 1957 quickly led to the Mattis-Bardeen theory of the linear electrodynamic response. However, for large currents approaching the critical value, the response is expected to become nonlinear, as discussed theoretically by Parmenter in 1962. In essence, the kinetic inductance of the superconductor is expected to increase at high currents, with the change in inductance varying as the square of the current. Connell's 1963 experimental study of this effect in Indium alloys led him to propose a parametric amplifier using thin-film superconducting transmission lines. However, Connell focused his attention on standing-wave transmission-line resonators, as suggested and patented by Landauer (U.S. Pat. No. 3,111,628); presumably the shock-wave issue deterred serious consideration of the traveling-wave version. The first experimental demonstration of parametric effects using superconducting films (tin) was given by Clorfeine. See, for example, A. S. Clorfeine, Microwave amplification with superconductors. Proc. IEEE, pages 844-845, 1964; and A. S. Clorfeine, Nonlinear Reactance and Frequency Conversion in Superconducting Films at Millimeter Wavelengths. Applied Physics Letters, 4:131-132, April 1964. In this experiment, the extremely large dielectric constant of rutile ($TiO_2$) was harnessed in a waveguide-coupled dielectric resonator in order to couple to the very low surface impedance of the superconducting film in order to obtain 11 dB gain at 6 GHz with a gain-bandwidth product of around 1 MHz. This narrow bandwidth meant that the device had little practical value beyond a basic demonstration, and while the topic continued to receive theoretical attention on occasion, the focus of experimental work shifted to other more promising directions.

Josephson Parametric Amplifiers

In 1967, Zimmer reported on experiments similar to those of Clorfeine. He conjectured that Clorfeine's results were actually due to the nonlinearity of Josephson currents in naturally-occurring barriers (or weak links) in the very thin films being used, rather than the nonlinear behavior of the superconducting film itself. He then repeated the experiment using samples with intentionally fabricated Josephson junctions and found that the junction samples reliably showed parametric amplification. This triggered strong interest in the development of Josephson-junction parametric amplifiers, and by the late 1980s improved junction fabrication techniques allowed more sophisticated devices to be produced reliably, and narrowband microwave amplifiers with excellent noise performance approaching the quantum limit were demonstrated.

Traveling-Wave Josephson Parametric Amplifiers

In an effort to improve the bandwidth, the traveling-wave Josephson parametric amplifier was proposed 25 years ago (M. Sweeny and R. Mahler, A travelling-wave parametric amplifier utilizing Josephson junctions. IEEE Trans. Magn., 21:654, March 1985), and is shown in FIG. 1A. Amplifiers of this type have in fact been demonstrated and have a gain-bandwidth product comparable to or better than any superconducting parametric amplifier to date. Such devices have recently received renewed attention. The traveling-wave amplifier uses a series array of Josephson junctions that are distributed along a coplanar waveguide transmission line. The junctions are in their superconducting state and can carry a Josephson supercurrent. The associated "Josephson inductance" effectively contributes a series inductance $\mathcal{L}_J$ per unit length to the transmission line, and this inductance increases with the current I until the junction critical current is reached, at which point the junctions switch into their resistive state and the line suddenly becomes very lossy. Below the critical current, the line remains low-loss, but the phase velocity $\xi = 1/\sqrt{\mathcal{L}C}$ of a wave decreases as the wave amplitude increases. This nonlinear behavior is equivalent to the Kerr effect in optical materials, in which the refractive index is intensity dependent.

The operation of this device can be understood in a straightforward way. Imagine a strong pump wave at frequency $f_P$ traveling down the transmission line, emerging at the output end. If we change the pump amplitude, the phase of the wave at the output will change due to the amplitude-dependent phase velocity of the line. Now, imagine that the pump amplitude is kept constant, but a small "signal" wave $f_S$ is added at a nearby frequency. The sum of the pump and signal waves produces an amplitude envelope that varies sinusoidally at the difference or "beat" frequency $|f_S - f_P|$, and therefore the wave that emerges at the output has a phase $\phi$ that also varies at this difference frequency. In other words, the nonlinear transmission line transfers amplitude modulation into phase modulation. If the nonlinearity is sufficiently strong, this effect can produce gain at the signal frequency. In addition, phase modulation of the pump implies the existence of an "idler" frequency at the output, whose frequency is located at the "mirror image" of the signal frequency with respect to the pump, $f_I = 2f_P - f_S$.

FIG. 1A is a schematic diagram of a prior art traveling-wave Josephson parametric amplifier proposed by Sweeny and Mahler in 1985 (M. Sweeny and R. Mahler, cited above). FIG. 1B is a plan diagram of the traveling-wave Josephson parametric amplifier shown in FIG. 1A. FIG. 1C is a graph showing measured gain (in dB) vs. signal frequency offset ($|f_S-f_P|$) of a 20 GHz Josephson parametric amplifier of the type shown in FIG. 1A, as demonstrated by Yurke et al. (B. Yurke, M. L. Roukes, R. Movshovich, and A. N. Pargellis. A low-noise series-array Josephson junction parametric amplifier. Appl. Phys. Lett., 69:3078-3080, November 1996). The gain-bandwidth product of this device is 500 MHz. The input and output impedance match for this particular device was poor, so it was likely operating in a partial standing-wave mode. Another example is described by E. M. Levenson-Falk et al, arXiv:1101.4672v1 [cond-mat.supr-con] 24 Jan. 2011. The amplifier described in that paper has sqrt(G) of about 10 over 40 MHz, so it appears to have a gain bandwidth product of 400 MHz.

Also known in the prior art is Lentz, U.S. Pat. No. 2,962,681, issued Nov. 29, 1960, which is said to disclose superconductor circuits fabricated in the form of transmission lines and including superconductor gate conductors which are selectively driven resistive to control the current in the circuits, wherein the resistance of the gate conductors is so related to the characteristic impedance of the transmission lines that optimum switching speeds are obtained.

Also known in the prior art is Tien, U.S. Pat. No. 3,012,203, issued Dec. 5, 1961, which is said to disclose parametric amplification by controlled reactance variation into the domain of traveling waves. It provides an extended, traveling wave-supporting structure, proportioned to support traveling waves of the frequencies of interest and preferably, also, to suppress waves of frequencies not of interest. Among the waves of interest is a wave of reactance variation launched by the source of pumping energy. The others are the wave to be amplified and at least one auxiliary wave. The structure is proportioned to cause the waves of interest to travel with the phase speeds and group speeds that are most advantageous in promoting the gain-producing interaction among them; in particular with the phase speeds that satisfy a certain relation among the phase constants.

Also known in the prior art is Landauer, U.S. Pat. No. 3,111,628, issued Nov. 19, 1963, which is said to disclose improved parametric circuits of the distributed constant type which utilize the phenomenon of superconductivity. Briefly, this invention includes a non-linear superconductive transmission line wherein the non-linearity of the transmission line is a function of the penetration depth of magnetic fields into the conductors of the line.

Also known in the prior art is Garwin et al., U.S. Pat. No. 3,297,875, issued Jan. 10, 1967, which is said to disclose a traveling wave parametric device operable at optical frequencies that is provided by applying to a non-linearly polarizable medium one or more optical waves, the medium being capable of supporting a plurality of optical waves which are frequency related to the applied wave or waves and for which the wave velocities are matched to the supporting medium, this latter condition expressing the requirement that this plurality of waves interferes constructively from point to point as they commonly propagate through the supporting medium.

There is a need for improved traveling wave parametric amplifiers.

SUMMARY OF THE INVENTION

According to one aspect, the invention features a traveling wave kinetic inductance parametric amplifier. The traveling wave kinetic inductance parametric amplifier comprises a transmission line having at least one data signal input port, having at least one pump signal input port and having at least one data signal output port, the transmission line configured to provide a nonlinear interaction between a pump signal and a data signal that are present simultaneously in the transmission line, the transmission line comprises a superconducting material having a high kinetic inductance, and configured to provide superconducting behavior below a critical temperature and a critical current density; and a dispersion control element coupled to the transmission line and configured to control a dispersion relation of waves propagating on the transmission line, the combination of the transmission line and the dispersion control element providing a traveling wave kinetic inductance parametric amplifier. Examples of waves propagating on the transmission line are pump signals and data signals.

In one embodiment, the superconducting material having a high kinetic inductance has a high normal state resistivity.

In another embodiment, the superconducting material having a high kinetic inductance comprises nitrogen (N) and a metal selected from the group consisting of titanium (Ti), niobium (Nb) and vanadium (V).

In yet another embodiment, the dispersion control element of the traveling wave kinetic inductance parametric amplifier is configured to control a gain.

In still another embodiment, the dispersion control element provides negative dispersion.

In a further embodiment, the dispersion is configured to be a function of frequency.

In yet a further embodiment, the data signal comprises a frequency in the range of 0.1 to 1000 GHz.

In an additional embodiment, the traveling wave kinetic inductance parametric amplifier is configured to exhibit a gain bandwidth of 1.6:1 or larger between an upper cutoff frequency and a lower cutoff frequency.

In one more embodiment, the traveling wave kinetic inductance parametric amplifier is configured to exhibit a gain of 10 dB or greater.

In still a further embodiment, the traveling wave kinetic inductance parametric amplifier is configured to exhibit a noise temperature below 100 mK/GHz.

In yet an additional embodiment, the dispersion control element is a high-pass filter.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 1A is a schematic diagram of a prior art traveling-wave Josephson parametric amplifier.

FIG. 1B is a plan diagram of the traveling-wave Josephson parametric amplifier shown in FIG. 1A.

FIG. 1C is a graph showing measured gain (in dB) vs. signal frequency offset ($|f_S-f_P|$) of a 20 GHz Josephson parametric amplifier of the type shown in FIG. 1A.

FIG. 2A through FIG. 2E illustrate the prior art standing-wave Josephson Parametric Amplifier, or JPA, developed at NIST/Colorado.

FIG. 2A shows the amplifier chip, which is 5 mm long, and has wire bonding pads at the ends and a Josephson transmission line in the middle.

FIG. 2B shows the Josephson junctions, placed in a SQUID geometry to allow tuning of the Josephson inductance with a magnetic field.

FIG. 2C shows the measured gain response, which has a gain-bandwidth product around 40 MHz, considerably lower than for the traveling-wave version shown in FIG. 1A.

FIG. 2D and FIG. 2E are blow-up images that show the input and output coupling capacitors, which act as partial "mirrors" and form the standing wave on the line.

FIG. 5A shows a superconducting (YBCO) double-spiral meandered delay line fabricated on a 50 mm $LAlO_3$ wafer.

FIG. 5B is a closeup of the contact structure for the delay line.

FIG. 5C is a closeup of the meandered coplanare waveguide line.

FIG. 5D is a graph that shows this structure achieves very wideband, nearly dispersion-free time delay of 25 ns.

FIG. 6A illustrates the physical layout of a double-spiral traveling-wave kinetic inductance amplifier.

FIG. 6B shows the measured transmission $S_{21}$ of a device of the type shown in FIG. 6A, in the presence of a pump signal at a frequency near 6.05 GHz.

FIG. 6C shows the power gain G is plotted against the power-induced phase shift.

FIG. 9A shows the physical layout of a double-spiral, dispersion engineered, traveling-wave kinetic inductance (DTWKI) parametric amplifier.

FIG. 9B shows the CPW line width is perturbed periodically by a short wider section.

FIG. 9C shows the small-signal transmission $S_{21}$ of the structure shown in FIG. 9A.

DETAILED DESCRIPTION

DTWKI Amplifier Characteristics

Figure 3B:
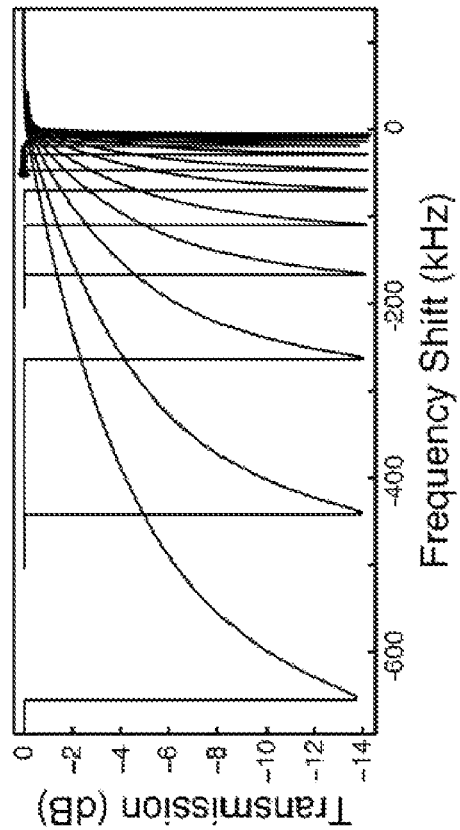
FIG. 3B illustrates the effect of increasing microwave readout power on the resonance line shape of a 2 GHz TiN thin film resonator.

We describe a new superconducting amplifier with exceptional performance, closely approaching the limits imposed by fundamental physics. We refer to this device as the Dispersion-engineered Traveling-Wave Kinetic Inductance (DTWKI) amplifier. Versions of this device may be implemented for operation in the microwave, millimeter-wave, and sub-millimeter-wave bands. The basic characteristics are demonstrated to be, or are expected to be, as we now describe.

The amplifier is expected to have extremely low noise and should operate very close to the fundamental limits imposed by quantum mechanics. At frequency f, this limit corresponds to a noise temperature of $T_{QL}=hf/k_B$, where h and $k_B$ are Planck's and Boltzmann's constants, respectively. Numerically, $h/k_B \approx 48$ mK/GHz. For comparison, modern low-noise transistor amplifiers operating at cryogenic temperatures offer noise temperatures of order 1 K/GHz.

The gain bandwidth may be extremely wide, with a ratio of 10:1 or larger between the upper and lower cutoff frequencies. For low-noise transistor amplifiers, comparably wide bandwidths have been demonstrated only below ~10 GHz.

The amplifier can be designed to have a very large dynamic range. Output saturation levels around −10 dBm (0.1 mW) or larger are possible; for a power gain of 20 dB this corresponds to input power levels of order −30 dBm. These values are comparable to those for existing low-noise transistor amplifiers.

The power dissipation of the amplifier is extremely low. Application of a monochromatic "pump" frequency is required for the amplifier to operate, but only a very small fraction of the pump power will be dissipated in the amplifier.

Fabrication of the superconducting devices used in these amplifiers uses standard techniques of thin-film deposition and lithography. The fabrication process is straightforward and relatively simple, so consequently relatively high yields and low costs may be expected. The superconducting devices are expected to be very robust and not prone to damage due to static discharge.

These amplifiers are expected to be very versatile and should find applications in a wide range of fields and applications where sensitivity is paramount, including astronomy, fundamental physics experiments, superconducting detector readout and multiplexing, quantum information and quantum computing, low-temperature physics, and others.

Distinguishing Features

The DTWKI amplifier may be classified as a type of traveling-wave parametric amplifier. The DTWKI amplifier concept incorporates several features that distinguish it from previous work:

The DTWKI amplifier uses the nonlinearity of the kinetic inductance in a superconducting film to achieve amplification in a traveling-wave device.

The DTWKI amplifier is enabled by the excellent properties of materials such as titanium nitride (TiN), niobium titanium nitride (NbTiN), vanadium nitride (VN), and other high-resistivity superconductors. Recent work has shown that thin films made using such materials simultaneously satisfy the three requirements for the DTWKI amplifier: 1) The materials have high kinetic inductance as a consequence of their high normal state resistivity. Large values of kinetic inductance are needed to obtain sufficient gain per unit length for the device to be practical. 2) The losses (dissipation) at microwave frequencies are exceptionally low, allowing the gain to overcome the loss, and leading to excellent noise performance. (3) Acceptably large values of nonlinearity may be obtained at reasonable values of pump power, without sacrificing the microwave loss.

The DTWKI amplifier uses a thin-film transmission line with length long enough to achieve the desired gain but arranged in a compact pattern to minimize the overall device size. A typical pattern is a double-spiral.

The superconducting transmission line used for the DTWKI amplifier incorporates a periodic variation of its structure along its length. This periodicity simultaneously accomplishes two goals: 1) suppression of the development of a shock front in the pump waveform, which otherwise would prevent achieving high gain; 2) the dispersion relation of the line is tailored in such a way as to access the exponential, high gain regime over a very broad bandwidth.

We have discovered in laboratory experiments the very favorable nonlinear behavior of superconducting nitride films at microwave frequencies. The first laboratory experiments that provided a proof-of-concept demonstration at 6 GHz that were performed by Day.

The analysis of Josephson parametric amplifiers can be made more quantitative. Because the inductance cannot depend on the sign of the current, the first term in a series expansion must be quadratic, $$\mathcal{L}_J(I) = \mathcal{L}_J(0)[1+(I/I_*)^2] \qquad (1)$$

where $I_*$ sets the scale of the effect. This equation may also be obtained by directly considering the Josephson current-phase relationship $I=I_C \sin \phi$ along with the equation that governs the time evolution of the phase, $d\phi/dt=2\,eV/h$, and performing a Taylor expansion. Therefore, change in the phase velocity also varies as $I^2$, or power, so the power-dependent phase shift of the pump at the output can be expressed, to first order, as $$\Delta\phi(P_P) = \phi(P_P) - \phi(0) \quad \Delta\phi_{max} \frac{P_P}{P_{max}}. \qquad (2)$$

Here $P_{max}$ is the maximum pump power $P_P$ that can be applied before the line loss increases to an unacceptably large value, and $\Delta\phi_{max}$ is the associated power-induced phase shift. An input signal with power $P_S \ll P_P$ effectively causes the pump power to be modulated by an amount $\delta P = \pm 2\sqrt{P_S P_P}$. Therefore, the phase modulation at the output is $$\delta\phi = 2\Delta\phi_{max} \frac{\sqrt{P_P P_S}}{P_{max}}. \qquad (3)$$

This phase modulation of the pump corresponds to an output wave amplitude of $\sqrt{P_P}\delta\phi$, which carries a power of $P_P \delta\phi^2/2$. Half of this power is at the idler frequency, so therefore the signal power gain is $$G_S = 1 + \frac{P_P \delta\phi^2}{4P_S} \qquad (4)$$
$$= 1 + \frac{\Delta\phi_{max}^2 P_P^2}{P_{max}^2}$$
$$= 1 + \Delta\phi^2(P_P)$$

where the first term accounts for the input signal power. It is interesting to note that this result implies that the gain grows quadratically with the transmission line length L (since $\Delta\phi \propto L$) rather than exponentially, as we would expect for a medium with constant gain per unit length. The reason for this is straightforward: the nonlinear transmission line acts only on the amplitude-modulated component of the pump, so the phase-modulation components generated in the initial sections of the line cannot be re-amplified by the later sections as would be needed for exponential gain. Rather, the total amplitude of the phase-modulation component builds up linearly with line length, and so the power gain is quadratic. As described by Landauer, the formation of shock fronts in the pump waveform limits the maximum gain that can be achieved, unless appropriate countermeasures are taken.

Standing-Wave Josephson Parametric Amplifiers

One of the advantages of the traveling-wave amplifier shown in FIG. 1A is bandwidth: the device is fundamentally wideband, and in principle is capable of amplifying signals with arbitrary offsets from the pump. In addition, it has a unilateral response: it only amplifies signals that are traveling in the direction of the pump. However, the wide bandwidth can also be a problem, since it means that the impedance environment must be controlled over a broad frequency range, which can be difficult. Another issue is gain. A longer line produces more gain, but also requires more junctions, which leads to yield issues during device fabrication.

One solution to these problems is to use a standing-wave design, in which the Josephson transmission line is contained in a resonant cavity. This effectively leads to a longer line length since the pump and signal make repeated passes, so fewer junctions are required. However, the device is now narrow-band. A partial solution to this problem is to use junction pairs in the form of SQUIDs rather than single junctions, which allows the resonant frequency to be tuned with a magnetic field. This leads to an amplifier that is narrow-band but tunable.

As shown in FIG. 2A through FIG. 2E, such amplifiers have been built, and show outstanding noise performance, closely approaching the quantum limit in the so-called non-degenerate mode, when the pump and signal frequencies are distinct, in which case the standard quantum limit $T_{amp} \geq hf/k_B$ applies. The amplifier can also be operated in the degenerate mode, when the pump and signal frequencies coincide. In this case, the amplifier is phase-sensitive, since it only amplifies the quadrature component that is in phase with the pump, and so the amplifier can (and does) have noise less than the standard quantum limit for this quadrature.

FIG. 2A through FIG. 2E illustrate the prior art standing-wave Josephson Parametric Amplifier, or JPA, developed at NIST/Colorado.

FIG. 2A shows the amplifier chip, which is 5 mm long, and has wire bonding pads at the ends and a Josephson transmission line in the middle. FIG. 2B shows the Josephson junctions, placed in a SQUID geometry to allow tuning of the Josephson inductance with a magnetic field. This allows the resonance frequency to be adjusted over a wide range. FIG. 2C shows the measured gain response, which has a gain bandwidth product around 40 MHz, considerably lower than for the traveling-wave version shown in FIG. 1A. FIG. 2D and FIG. 2E are blow-up images that show the input and output coupling capacitors, which act as partial "mirrors" and form the standing wave on the line.

Kinetic Inductance Parametric Amplifiers

The nondissipative linear response of a superconductor may be described in terms of an effective penetration depth $\lambda_{eff}$, a surface reactance $X_S$, or a surface inductance $L_S$. These are all related: $X_S = \omega L_S = \omega\lambda_0 \lambda_{eff}$. The surface inductance is often referred to as the "kinetic inductance", because its physical origin is tied to the kinetic energy of the electron pairs (Cooper pairs) that carry the supercurrent. Meanwhile, for frequencies below the gap frequency $v_g \approx 3.5\,k_B T_c/h \approx (T_c/1\,K) \times 80$ GHz, the dissipative linear response is controlled by the density of unpaired single electrons, and according to theory, the density and dissipation diminish exponentially as the temperature is reduced.

Any system, if subjected to large enough perturbations, becomes nonlinear. In superconductors, the scale of the non-linearity is set by the critical current. The fact that the kinetic inductance varies with current is therefore to be expected on physical grounds, and is predicted by both the phenomenological Ginzburg-Landau theory and the microscopic BCS theory. Just as in the case of Josephson junctions, to lowest order the variation of the kinetic inductance with current is expected to be quadratic, as described in Eqn. (1). Therefore, one can conceive of both traveling-wave as well as standing-wave parametric amplifiers that make use of the nonlinearity of the kinetic inductance. Because the dissipation in superconductors can be extremely low, their nonlinearity can be nearly ideal, and kinetic inductance parametric amplifiers can in principle closely approach ideal behavior. Furthermore, the dissipation of superconductors remains low up to the gap frequency (e.g. for $v_g \approx 1200$ GHz for NbTiN with Tc=16 K), so kinetic inductance parametric amplifiers can in principle operate well into the mm-wave and sub-mm-wave range.

There have been numerous proposals for practical applications of the nonlinear kinetic inductance effect, but few success stories. For instance, in 1989 Anlage, Snortland, and Beasley proposed a current-controlled mm-wave phase shifter, using the current-dependent kinetic inductance to modify the phase velocity of a transmission line. The experiment using Nb microstrip resonators was unsuccessful: instead of observing shifts in the resonance frequency as a function of bias current, they saw increased dissipation and a reduced resonator quality factor Q, illustrating one of the key pitfalls to be avoided for this type of device. A more recent example is the study of the nonlinear behavior of NbN microresonators, which indicated that dissipation and consequent heating due to currents flowing through grain boundaries played a major role. Such behavior is highly undesirable for low-noise parametric amplifiers.

More recently, a careful study of the frequency shifts of niobium coplanar waveguide (CPW) resonators in a magnetic field showed that the effect varies as $B^2$, suggesting that field-induced circulating currents together with the nonlinear kinetic inductance were responsible. More to the point, Thölen et al. were able to achieve parametric amplification at 3 and 6 GHz in a standing-wave device using the nonlinear kinetic inductance in niobium coplanar waveguide (CPW) microresonators; with a peak gain of 22 dB and very narrow (kHz) fixed-tuned, resonator-limited bandwidths.

Traveling-Wave Kinetic Inductance Parametric Amplifiers

In the late 1960s, researchers interested in superconducting parametric devices shifted their focus away from thin films and towards Josephson-junctions, where it has remained until now. The primary reason for this shift is that the junctions were much easier to use in practical circuits: the inductive impedance $h/2eI_C$ is controlled by the critical current $I_C$ and can be brought into the experimentally comfortable range around 50. Meanwhile, Clorfeine had to resort to extreme measures involving the use of rutile resonators in order to achieve a narrow-band coupling to the very low surface reactance Xs of his superconducting films. The work of Tholen et al. illustrated a different solution to this problem: the use of a high-Q transmission-line resonator to provide a long effective pathlength in order to overcome the small value of the surface reactance as well as the relatively weak nonlinearity of the material. The problem of the extremely narrowband frequency response may be overcome by unfolding the propagation path of Tholen's resonator into a single-pass transmission line, which results in a wideband traveling wave device. However, Tholen used a resonator with a length of 23 mm and a quality factor of Q=59,000, so when unfolded the length would be around 1.4 km! This is clearly not practical for a microfabricated device.

However, the pathlength required for achieving gain in a traveling-wave kinetic inductance amplifier is considerably smaller. If the maximum achievable fractional nonlinearity for a given material is $\psi_{max} = \Delta L_{s,max}/L_s$, where $\Delta L_{s,max}$ is the maximum current-induced perturbation to the surface inductance, the corresponding power-induced phase shift is given by $$\Delta \phi_{max} \sim \frac{\alpha}{2} \psi_{max} \phi \qquad (5)$$

where $\phi$ is the total phase length of the line, and $\alpha$ is the fraction of the total inductance per unit length of the line that is contributed by the kinetic inductance. For good metals such as niobium or aluminum, typical values are $\alpha \sim 0.05$. Meanwhile, nonlinearity values of order $\psi_{max} \sim 1$-5% may be reasonable. Thus, for gain of 10 dB ($\Delta \phi_{max}$=3), we would need lines with phase length of order $\phi \sim 1$-$6 \times 10^3$, or 200-1000 wavelengths. At a frequency of 5 GHz, the actual length would be 10-40 m; still quite large, but now coming into range.

Figure 3A:
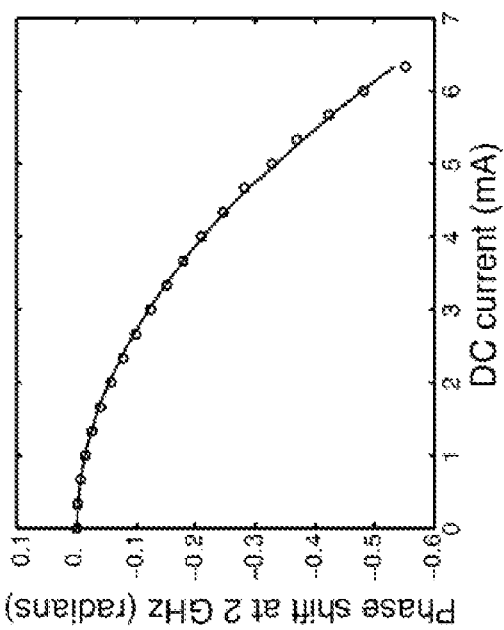
FIG. 3A is a graph that illustrates the nonlinearity of the kinetic inductance effects in TiN films.

The line length may be reduced by a large factor (20x) if the kinetic inductance fraction $\alpha$ approaches unity. Recent work has shown that certain superconducting nitrides, including TiN, NbTiN, VN, and perhaps other materials as well, can have quite high kinetic inductance by virtue of their large normal-state resistivity but also have very low microwave loss in their superconducting state. As shown in FIG. 3A and FIG. 3B, a TiN version of Anlage's phase shifter concept works very nicely, producing a current-induced phase shift of nearly 0.6 radians for a line with a total phase length of 21 radians. The corresponding dimensionless nonlinearity parameter is $\psi \approx 2 \times 0.56/21 \approx 5 \times 10^{-2}$. FIG. 3A and FIG. 3B also show that using TiN, we can avoid the pitfall of getting a nonlinearity but at the cost of losing Q. Indeed, large power-induced frequency shifts are observed for TiN resonators, but the resonance depth remains constant, indicating that microwave quasiparticle production or other heating effects are very low. This behavior is in stark contrast to the NbN films used by Abdo et al. which show strong increases in dissipation as the power is increased. We therefore conclude that using materials such as TiN and NbTiN, microwave traveling-wave kinetic inductance amplifiers are quite feasible if devices with transmission-line lengths of order ~1 m can be fabricated. At millimeter and submillimeter wavelengths, the required length drops by a factor of 10-100, to very manageable lengths in the range of 1-10 cm.

FIG. 3A is a graph that illustrates the nonlinearity of the kinetic inductance effects in TiN films. A TiN coplanar waveguide (CPW) transmission line was measured in transmission using a microwave network analyzer. The center strip was 5 μm wide, and the total phase length was 21 radians at 2 GHz. Using bias tees, a DC current was passed down the center strip, and the microwave phase shift displays a quadratic dependence with current. No comparable effect occurred when adjusting the voltage of the center strip relative to the ground planes. This shows that the kinetic inductance has a nonlinear behavior that is well described by eqn. (1). The microwave transmission dropped abruptly for currents in excess of ~6 ma.

FIG. 3B illustrates the effect of increasing microwave readout power on the resonance line shape of a 2 GHz TiN thin film resonator. As the power is increased, the microwave current in the resonator causes the inductance to increase, shifting the frequency downwards; this is classic "soft-spring" Duffing oscillator behavior. Interestingly, as indicated by the constant depth of the resonance, dissipation of the resonator changes very little—in fact, the change in resistance of the TiN is $<2\times10^{-4}$ less than the change in its reactance. The current in the resonator is ~1 mA at the highest power shown.

Figures 4A, 4B:
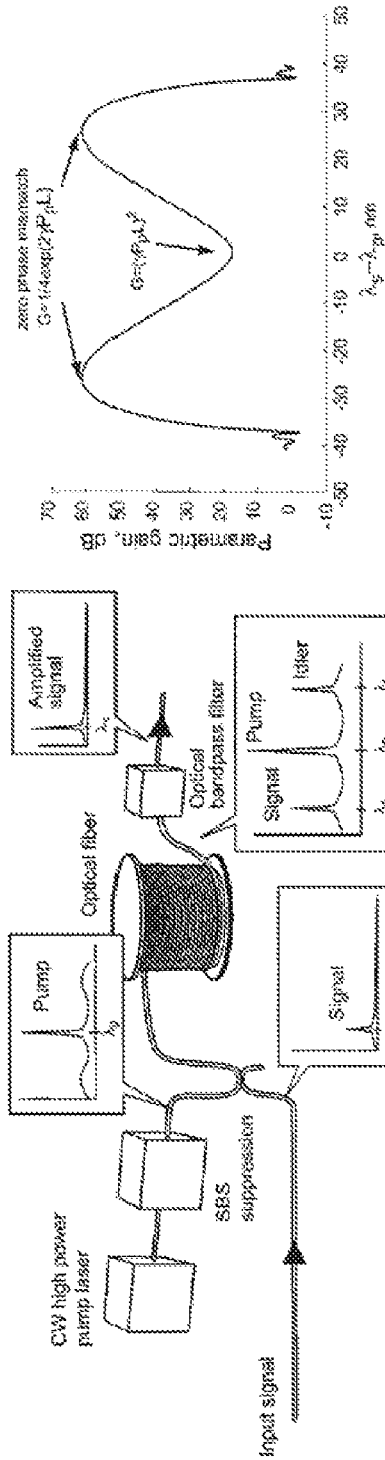
FIG. 4A illustrates the setup for an optical fiber parametric amplifier.
FIG. 4B shows the gain profile of a fiber parametric amplifier.

FIG. 4A illustrates the setup for an optical fiber parametric amplifier. Power from a pump laser is combined with the input signal, sent through the fiber spool, and an amplified version of the signal emerges from the other end of the fiber, along with the idler frequency. If desired, a filter can be used to select only the signal.

FIG. 4B shows the gain profile of a fiber parametric amplifier. For signal wavelengths (frequencies) near the pump, the gain varies quadratically with fiber length. However, exponential gain is possible if the fiber dispersion characteristics are favorable, leading to the two gain peaks located symmetrically about the pump, as indicated by the arrows.

A nonlinearity of $5\times10^{-2}$ may seem small, but it is very usable, as the optics community knows well. The optical fiber parametric amplifier of FIG. 4A has a nonlinearity parameter of only $~10^{-8}$, yet still manages to produce around 60 dB peak gain by virtue of the long length of fiber wrapped on the spool. Long superconducting delay lines are also quite feasible, and in fact there is a considerable literature on the subject.

FIG. 5A shows a superconducting (YBCO) double-spiral meandered delay line fabricated on a 50 mm $LAlO_3$ wafer. A 40 μm wide CPW center strip width was used. FIG. 5B is a closeup of the contact structure for the delay line. FIG. 5C is a closeup of the meandered coplanar waveguide line. FIG. 5D is a graph that shows, this structure achieves very wideband, nearly dispersion-free time delay of 25 ns. Because this device has rather wide (40 μm) lines, considerable size reduction is possible—a factor of 10 in area should be straightforward, leading to a device area of around 2 $cm^2$. At 6 GHz, a 25 ns delay corresponds to a total phase length of 940 radians. Propagation losses due to the expected surface layer of two-level systems or the superconductor will be completely negligible.

Amplifier saturation will occur when the power in the amplified signal starts depleting the pump power. For the currents indicated in FIG. 3A, the pump power would be ≥−10 dBm, and so saturation would occur for input powers around −40 dBm, which is comparable to the saturation power level of amplifiers using high electron mobility transistors (HEMTs). Thus, traveling-wave kinetic inductance amplifiers should have an extremely high dynamic range.

Furthermore, we know that the microwave dissipation in TiN is extraordinarily low, with $Q_i \geq 10^7$, so very little of the pump power will be absorbed. This line of thought is supported by the resonator measurements shown in FIG. 3A and FIG. 3B, which show that the resonator loss remains unchanged even when the resonator is driven far into the nonlinear regime. Indeed, at the largest power used, the microwave current in the resonator corresponds to ~1 mA, only a factor of 6 lower than the DC experiments. Thus, the low-temperature power dissipation of traveling-wave kinetic inductance amplifiers should be very low.

Proof-of-Principle Validation

FIG. 6A through FIG. 6C show some experimental results for a first-generation device using NbTiN films and a double-spiral delay line structure with an overall path length of ~1 m.

FIG. 6A illustrates the physical layout of a double-spiral traveling-wave kinetic inductance amplifier. This is a single-layer device: a superconducting film is deposited and patterned. The spiral has an outer diameter of 1.6 cm. The transmission line is a coplanar waveguide (CPW) with a center strip width of 1 μm and gaps between the center strip and ground plane of 1 μM. The total line length is 1 m. When implemented using a 20 nm NbTiN film, the characteristic impedance of the line is expected to be 300Ω and not well matched to the 50Ω coaxial lines at the input and output, leading to reflections and standing waves.

FIG. 6B shows the measured transmission $S_{21}$ of a device of the type shown in FIG. 6A, in the presence of a pump signal at a frequency near 6.05 GHz. As the pump power (around −11 dBm) is increased, the standing-wave transmission peaks shift to lower frequencies, as expected due to the increase in the kinetic inductance. In addition, the transmission at the peaks increases by up to ~6 dB. The transmission scale is uncalibrated; because the superconducting film is known to have very low loss, we expect the peak small signal transmission shown as −35 dB to actually correspond to a device transmission of 0 dB. Therefore, these measurements indicate that a parametric gain of around 6 dB is being achieved.

FIG. 6C shows the power gain G is plotted against the power-induced phase shift Δϕ. Spectrum analyzer measurements show the presence of an idler signal at $f_i = 2f_P - f_S$, and efficient generation of the third harmonic of the pump at $3f_P$, as predicted.

Because of the strong impedance mismatch between the superconducting line and the coaxial input and output lines, this device was actually operating in a partial standing wave mode. This was the very first device to be tested, and produced good results, indicating that a high fabrication yield is readily achievable. Power gains as high as 10 dB were achieved at frequencies near 6 GHz. The largest power-induced phase shift measured was nearly 4 radians per meter. The presence of an idler signal as well as efficient third-harmonic generation were confirmed using spectrum analyzer measurements. This experiment verifies that our physical understanding of the nonlinear behavior of NbTiN is correct and that suitable devices can in fact be fabricated.

Dispersion Engineering

There are two more ingredients that are needed in order to produce a fully optimized device. First, the issue of shock-wave generation as predicted by Landauer must be dealt with. The well-known equation V=LdI/dt for the voltage across an inductor makes it apparent that a nonlinear inductance of the form $L=L_0(1+I^2/I_*^2)$ will lead to the generation of the third harmonic $3f_P$ of the pump frequency $f_P$ via the term $I^2 dI/dt$. This process is the first step in the formation of the shock front: once the third harmonic is present, the higher harmonics $5f_P$, $7f_P$, etc., can be generated, and these summed together form the shock front. Indeed, a quick calculation shows that the condition for the amplitude of the third harmonic to become comparable in strength to the fundamental is essentially the same as for achieving parametric gain: both require Δϕ~1. Experimentally, we observe this to be the case for the device shown in FIG. 6A; it is quite possible that the maximum gain achieved with this device is limited by shock front formation, as predicted by Landauer. The second issue to be dealt with is related to the first. The fact that the gain is expected to grow only quadratically with line length, rather than exponentially, is inconvenient and forces us to use longer lines than might otherwise be necessary.

Both of these problems may be solved in a simple fashion using dispersion engineering. In contrast to our nearly dispersionless superconducting transmission lines, dispersion is a serious issue in an optical fiber, and can cause loss of phase match between the signal, idler, and pump waves. In addition, the presence of dispersion in the fiber completely solves the shock wave problem because the third harmonic wave is very poorly phase-matched to the pump. Consequently, dispersion is included the theory of fiber parametric amplifiers. Because the physics is identical—the fiber has an intensity-dependent phase velocity—the theory applies perfectly well to the superconducting case. According to theory, the signal gain of a traveling-wave amplifier is $$G_S = 1 + \left[\frac{\gamma P_P}{g}\sinh(gL)\right]^2. \quad (6)$$

Here L is the length of the fiber, is a measure of the nonlinearity such that $\Delta\phi=\gamma P_P L$ is the power-dependent phase shift, the parameter g depends on dispersion $\Delta\beta$, $$g^2 = -\Delta\beta\left[\frac{\Delta\beta}{4} + \gamma P_P\right] \quad (7)$$

and the dispersion in turn depends on values of the propagation constant $\beta(\omega)$ at the signal, idler, and pump frequencies through $$\Delta\beta=\beta(\omega_S)+\beta(\omega_I)-2\beta(\omega_P) \quad (8)$$

The presence of sin h(gL) in the gain expression tells us that, despite our previous discussion, exponential gain is indeed possible, provided that g is real, which in turn requires $-4\gamma P_P<\Delta\beta<0$; maximum gain occurs when $\Delta\beta=-2\ \gamma P_P$, which translates to $\Delta\beta/\beta\ (\omega_P)=-2\Delta\phi/\phi_P$. In other words, the fractional dispersion should be negative, with a value equal to twice the dimensionless nonlinearity parameter. As a check, in the case of zero dispersion $\Delta\beta\rightarrow0$, we recover quadratic gain $G_S\rightarrow1+(\gamma P_P L)^2$.

The origin of the exponential gain and its connection to dispersion are easily understood. Because of dispersion, the phase-modulation of the pump produced by the nonlinearity of the line is converted to amplitude modulation as it propagates, and therefore the nonlinearity can act on it again, producing exponential gain. However, the sign of this feedback effect is important, and that is why $\Delta\beta<0$ is required.

Figure 7B:
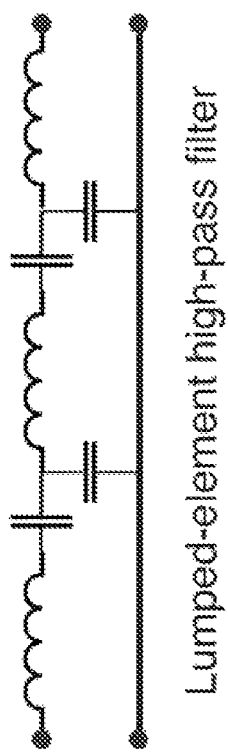
FIG. 7B illustrates a lumped-element highpass filter circuit.
Figure 7C:
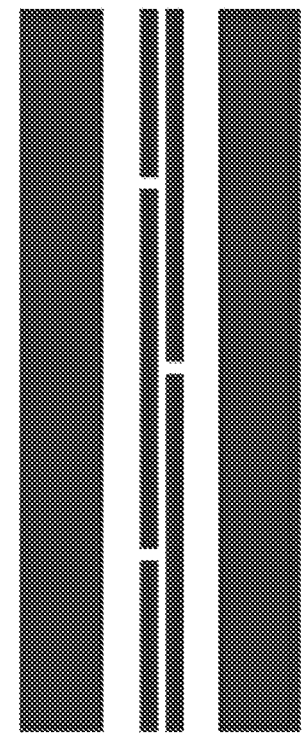
FIG. 7C illustrates a lumped-element highpass filter which is shown as a coplanar waveguide (CPW) structure.
Figure 8:
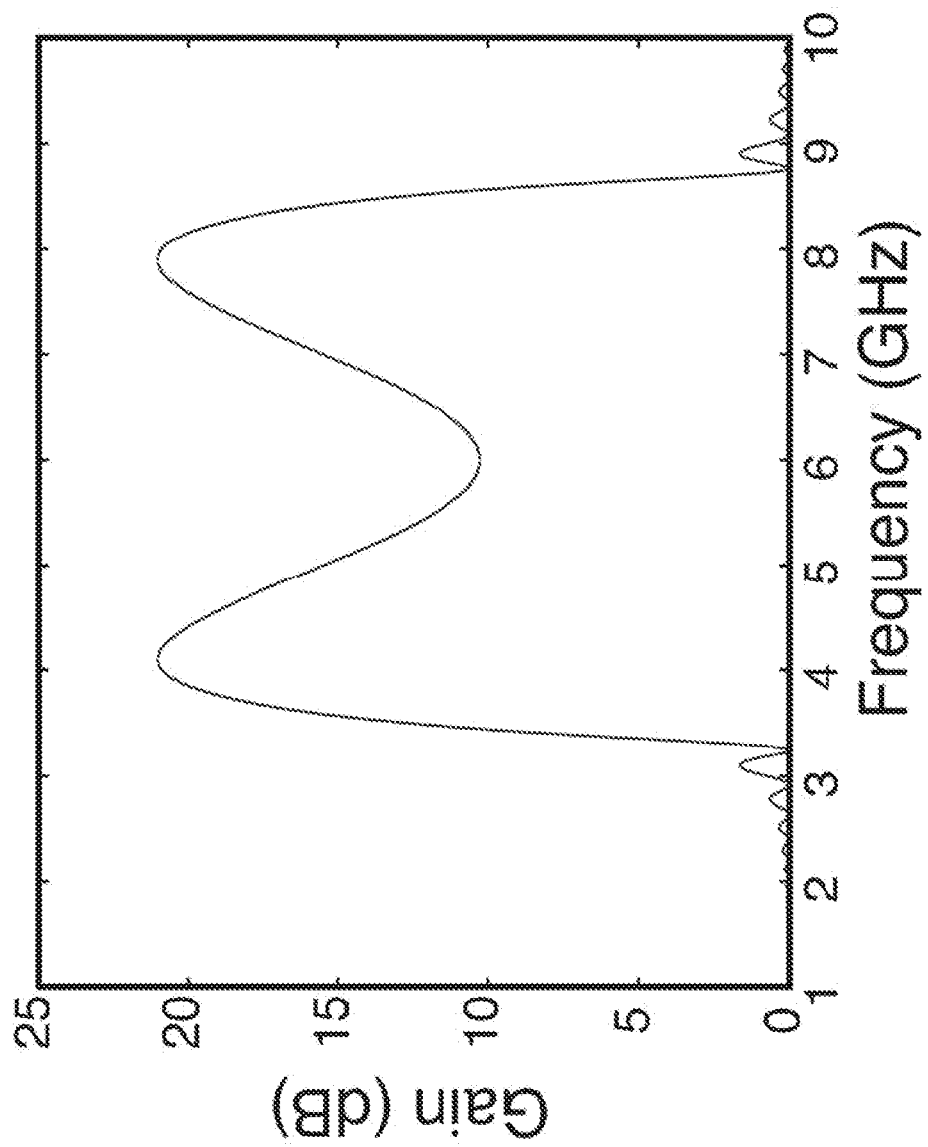
FIG. 8 shows the gain profile calculated for a 4.2 GHz traveling-wave TiN nonlinear kinetic inductance parametric amplifier, which exhibits the features seen in the fiber-optic version.

How can negative dispersion be achieved in a superconducting transmission line? FIG. 7B and FIG. 7C illustrate one embodiment. A high-pass filter naturally produces a region of negative dispersion in its passband near the turn-on frequency. One possible implementation is to introduce series capacitances in the transmission line, as shown in FIG. 7B. The dispersion relation of this structure has the form $$\beta(\omega) = \frac{\sqrt{\omega^2 - \omega_0^2}}{\bar{c}} \quad (9)$$

where $\bar{c}$ is the phase velocity at frequencies well above the cutoff frequency $\omega_0$. It is not hard to verify that this produces the desired negative dispersion, and the value of the dispersion at $\omega_P$ can be controlled by adjusting $\omega_0$. FIG. 8 shows the result of such an exercise: a 4 GHz amplifier with a bandwidth of 1 GHz and gain of 20 dB can be produced with the same length of line that gives 10 dB gain in the quadratic regime.

Figure 7A:
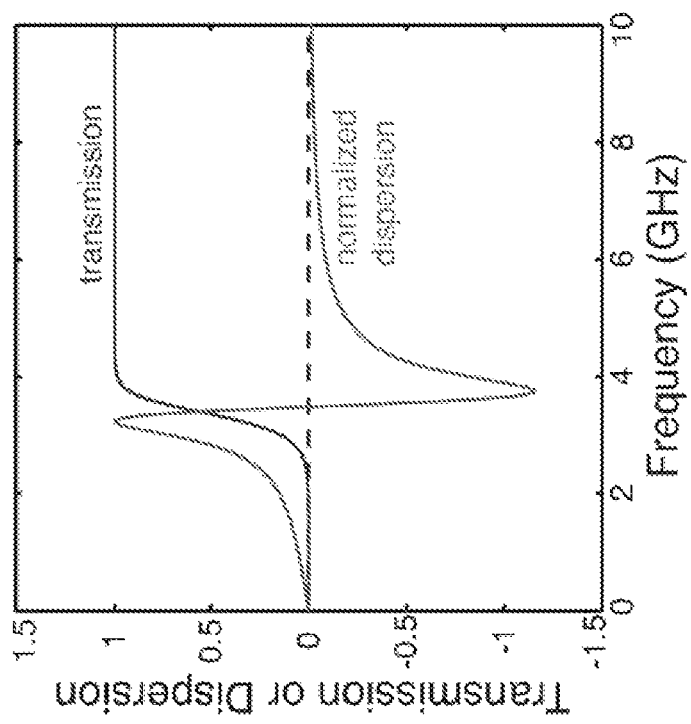
FIG. 7A shows the dispersion as a function of frequency for a high-pass filter, illustrating the broad region of negative dispersion that occurs above the turn-on frequency.

FIG. 7A shows the dispersion $(-\partial^2\phi(\omega)/\partial\omega^2)$ as a function of frequency for a high-pass filter, illustrating the broad region of negative dispersion that occurs above the turn-on frequency. The phase shift $\phi(\omega)$ and the transmission are related through a Hilbert transform, so the dispersion may be tailored by adjusting the turn-on characteristics of the filter. FIG. 7B illustrates a lumped-element highpass filter circuit. FIG. 7C illustrates a lumped-element highpass filter which is shown as a coplanar waveguide (CPW) structure.

FIG. 8 shows the gain profile calculated for a 4.2 GHz traveling-wave TiN nonlinear kinetic inductance parametric amplifier, which exhibits the features seen in the fiber-optic version. For this plot, the pump frequency was chosen to be 6 GHz; by applying a different pump frequency to the same physical device, the gain profile can be shifted in frequency over a broad range. This amplifier exhibits a peak gain around 20 dB and a −3 dB gain bandwidth of 1 GHz (3.7 to 4.7 GHz). The idler gain peak occurs near 7.8 GHz. In making this plot, a small value $(7\times10^{-4})$ was chosen for the dimensionless nonlinearity parameter, which corresponds to values demonstrated via nonlinear microwave resonance frequency shifts as shown in FIG. 3B. With this small value of nonlinearity, a chip area of order 7 cm$^2$ would be needed to achieve the desired gain. In order to achieve proper dispersion compensation, the high-pass cutoff frequency was placed at 0.7 GHz (see FIG. 7A).

A better approach is to apply dispersion only to the pump frequency. An examination of the dispersion equation $$\Delta\beta=\beta(\omega_S)+\beta(\omega_I)-2\beta(\omega_P). \quad (10)$$

shows that if the dispersion relation is modified only in the vicinity of the pump frequency, and a constant phase velocity applies at frequencies away from the pump, a constant, negative value of $\Delta\beta$ may be obtained over a very wide signal bandwidth. The desired modification to the dispersion relation is easy to arrange: one simply needs a small, periodic perturbation to the cross-section of the transmission line. The period should be set to half the pump wavelength, while the strength of the perturbation is dictated by the desired value of $\Delta\beta$, which in turn is controlled by the value of the dimensionless nonlinearity $\psi$. An analogous situation occurs when calculating the band structure of electrons in crystals. In that case, the periodic potential produced by the ions in the crystal leads to the development of gaps in the dispersion relation (energy vs. wavevector, or crystal momentum) of the electrons. Similarly, we expect the effect of a periodic, mild perturbation to a transmission line to result in a small "kink" in the dispersion relation. If the perturbation is made stronger, the "kink" develops into a forbidden gap, and frequencies that fall into that gap are unable to propagate. This effect may be used to block the development of the third harmonic of the pump, and therefore prevent shock-front formation.

These principles are illustrated in FIG. 9A through FIG. 9E. The double-spiral design shown in FIG. 6A now includes tapered adiabatic transformers to deal with the impedance matching problem. In addition, the use of a periodic variation of the width of the line produces a forbidden gap near 15 GHz, which is used to prevent shock front formation on the 5 GHz pump. In addition, every third "wider section" is also varied slightly, which produces the desired kink in the dispersion relation at the pump frequency that allows the correct value of negative dispersion to be obtained over a wide bandwidth. The final result of applying these techniques is a very wideband gain profile, as shown. For this plot, a nonlinearity of $\gamma P\approx5\ m^{-1}$ was used, only slightly larger than achieved in the first-generation device (see FIG. 6A). However, shock-wave generation may have limited the maximum nonlinearity for that device. If in fact the nonlinearity is limited to $\gamma P\leq4\ m^{-1}$, the line length could be increased achieve the gain profile shown in FIG. 9E.

Figure 9D:
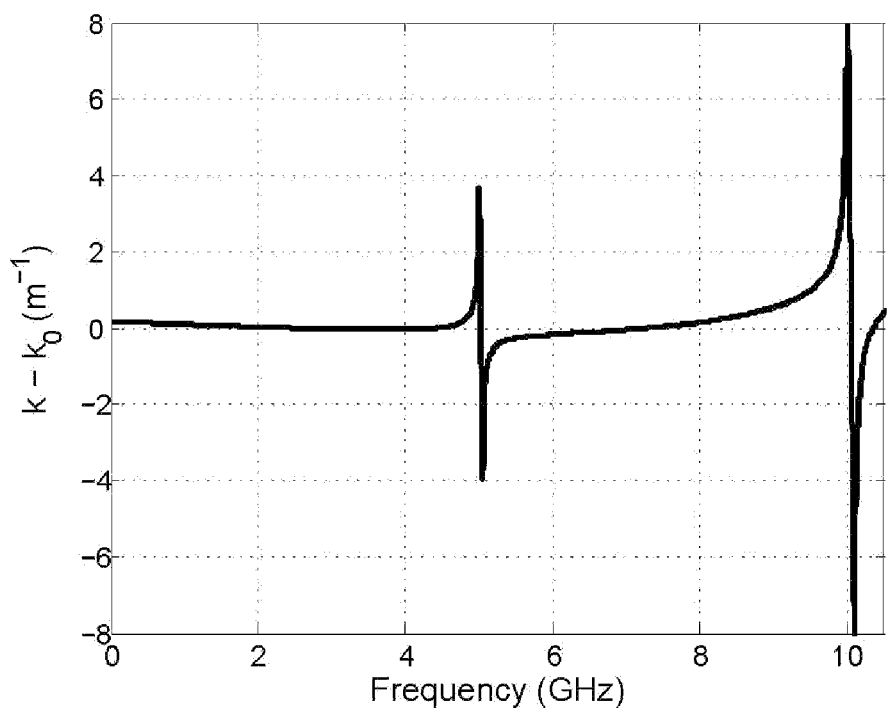
FIG. 9D shows the wave vector $k=\beta$ of the loaded line.
Figure 9E:
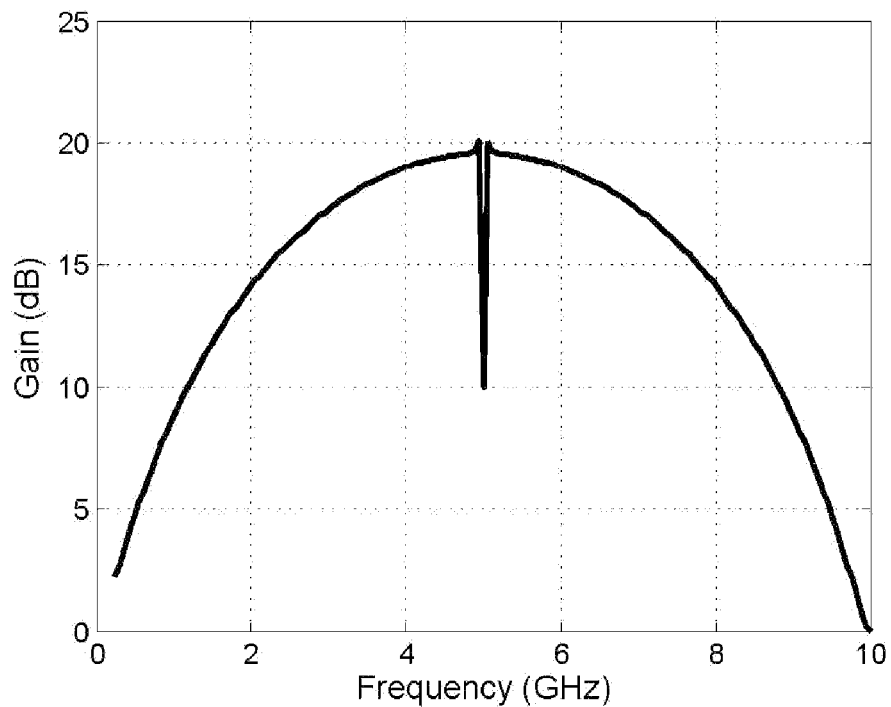
FIG. 9E shows the calculated gain profile of the dispersion-engineered device of FIG. 9A.

FIG. 9A shows the physical layout of a double-spiral, dispersion engineered, traveling-wave kinetic inductance (DTWKI) parametric amplifier. The spiral has an outer-diameter of 1.6 cm. The transmission line is a coplanar waveguide (CPW) with a center strip width of 1 μm and gaps between the center strip and ground plane of 1 μm. The total line length is 1 m; of this total, 0.2 m is used for adiabatic tapered-line sections at the input and output to provide impedance matching to 50Ω, leaving 0.8 m for the gain section. As shown in FIG. 9B, the CPW line width is perturbed Periodically by a short wider section (WS). In addition, every third such WS is varied slightly. FIG. 9C shows the small-signal transmission $S_{21}$ of the structure shown in FIG. 9A. The periodic perturbations to the line produces a stop-band region around 15 GHz, designed to prohibit growth of the third harmonic of the 5 GHz pump. In addition, smaller dips are seen around 5 GHz and 10 GHz, caused by varying every third WS. FIG. 9D shows the wave vector k=β of the loaded line. As compared to an unloaded line, the wave vector k=β of the loaded line exhibits small excursions around 5 GHz, caused by varying every third WS. By locating the 5 GHz pump on this feature and fine-tuning the pump frequency, the amount of dispersion $\Delta\beta=\beta(\omega_S)+\beta(\omega_I)-2\beta(\omega_P)$ may be adjusted to optimize the gain. FIG. 9E shows the calculated gain profile of the dispersion-engineered device of FIG. 9A. The calculated gain profile of this dispersion-engineered device shows a very wideband response for frequencies below the pump, and very nearly one octave of bandwidth for frequencies above the pump.

Figures 10A, 10B:
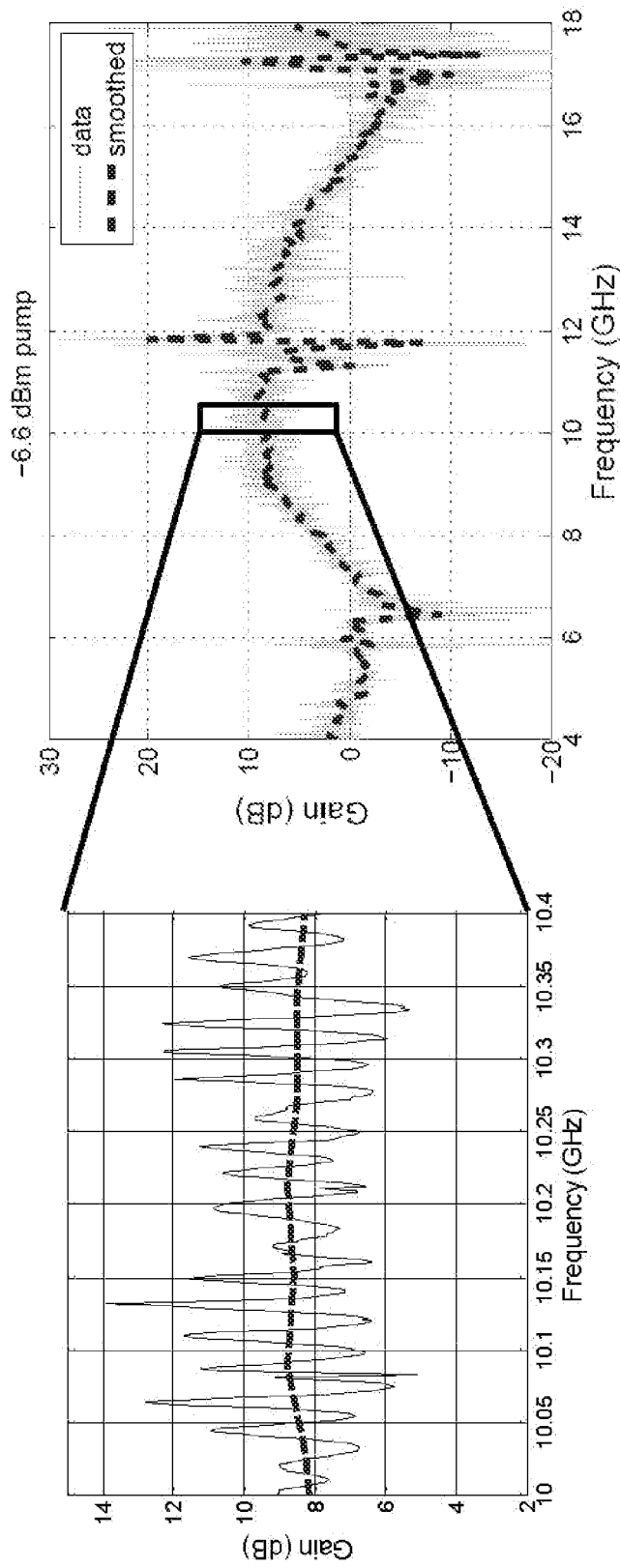
FIG. 10A is an expanded graph showing a portion of the data in FIG. 10B.
FIG. 10B is a graph that shows the measured gain of another embodiment of a DTWKI amplifier.

FIG. 10A is an expanded graph showing a portion of the data in FIG. 10B. FIG. 10B is a graph that shows the measured gain of another embodiment of a DTWKI amplifier with dispersion features similar to those described in FIGS. 9A through 9E. This amplifier was operated with a pump frequency of 11.56 GHz and achieved an average gain of 8 to 9 dB between 9 and 11 GHz and between 12 and 13 GHz. The gain showed rapid oscillations with frequency due to non-optimal impedance matching at the input and output of the device.

REFERENCES

[1] C. M. Caves. Quantum limits on noise in linear amplifiers. Phys. Rev. D, 26:1817-1839, 1982.
[2] J. R. Jeffers, N. Imoto, and R. Loudon. Quantum optics of traveling-wave attenuators and amplifiers. Phys. Rev. A, 47(4):3346-3359, April 1993.
[3] Sander Weinreb, Joseph C. Bardin, and Hamdi Mani. Design of cryogenic SiGe low-noise amplifiers. IEEE Transactions On Microwave Theory and Techniques, 55(11):2306-2312, November 2007.
[4] A. L. Cullen. A travelling-wave parametric amplifier. Nature, 181:332, 1958.
[5] P. K. Tien. Parametric Amplification and Frequency Mixing in Propagating Circuits. Journal of Applied Physics, 29:1347-1357, September 1958.
[6] A. L. Cullen. Theory of the travelling-wave parametric amplifier. Proc. IEE—Part B, 107(32):101-107, 1960.
[7] Ping King Tien. Traveling wave parametric amplifier. U.S. Pat. No. 3,012,203, December 1961.
[8] J. Hansryd and P. A. Andrekson. Broad-band continuous-wave-pumped fiber optical parametric amplifier with 49-dB gain and wavelength-conversion efficiency. IEEE Photonics Technology Letters, 13:194-196, March 2001.
[9] J Hansryd, P A Andrekson, M Westlund, J Li, and P O Hedekvist. Fiber-based optical parametric amplifiers and their applications. IEEE J. Sel. Top. Quantum Electron., 8(3):506-520, 2002.
[10] W. W. Mumford. Some notes on the history of parametric transducers. Proc. IRE, 48:848-853, May 1960.
[11] L. S. Nergaard. Nonlinear-capacitance amplifiers. RCA Review, pages 3-17, March 1959.
[12] W. H. Louisell, A. Yariv, and A. E. Siegman. Quantum Fluctuations and Noise in Parametric Processes. I. Physical Review, 124:1646-1654, December 1961.
[13] S. Weinreb, M. Balister, S. Maas, and P. J. Napier. Multiband low-noise receivers for a very large array. IEEE Transactions on Microwave Theory Techniques, 25:243-248, April 1977.
[14] Sander Weinreb. Tests of cooled 5 GHz parametric and GASFET amplifiers. Electronics Division Internal Report 203, National Radio Astronomy Observatory, Charlottesville, Va., 1980. 2
[15] M. E. Hines. The Virtues of Nonlinearity—Detection, Frequency Conversion, Parametric Amplification and Harmonic Generation. IEEE Transactions on Microwave Theory Techniques, 32:1097-1104, September 1984.
[16] J. J. Whelehan. Low-noise amplifiers-then and now. IEEE Transactions on Microwave Theory Techniques, 50:806-813, March 2002.
[17] A. A. Clerk, M. H. Devoret, S. M. Girvin, F. Marquardt, and R. J. Schoelkopf. Introduction to quantum noise, measurement, and amplification. Reviews of Modern Physics, 82:1155-1208, April 2010.
[18] R. Landauer. Parametric Amplification along Nonlinear Transmission Lines. Journal of Applied Physics, 31:479-484, March 1960.
[19] R. Landauer. Shock waves in nonlinear transmission lines and their effect on parametric amplification. IBM J. Res. Dev., 4(4):391-401, 1960.
[20] R. H. Kingston. Parametric amplification and oscillation at optical frequencies. Proc. IRE, 50:472,1962.
[21] N. M. Kroll. Parametric Amplification in Spatially Extended Media and Application to the Design of Tuneable Oscillators at Optical Frequencies. Physical Review, 127:1207-1211, August 1962.
[22] Richard L. Garwin, Wilton A. Hardy, and Rolf W. Landauer. Optical traveling wave parametric devices. U.S. Pat. No. 3,297,875, January 1967.
[23] A. B. Pippard. Field variation of the superconducting penetration depth. Proc. Roy. Soc. A, 203(1073):210-223, 1950.
[24] A. B. Pippard. An experimental and theoretical study of the relation between magnetic field and current in a superconductor. Proc. Roy. Soc. A, 216(1127):547-568,1953.
[25] J. Bardeen, L. N. Cooper, and J. R. Schrieffer. Theory of superconductivity. 108(5):1175-1204, 1957.
[26] D. C. Mattis and J. Bardeen. Theory of the anomalous skin effect in normal and superconducting metals. Phys. Rev., 111(2):412-417, 1958.
[27] R. H. Parmenter. Nonlinear electrodynamics of superconductors with a very small coherence distance. RCA Review, 23:323-352, 1962.
[28] R. A. Connell. Characteristics of the penetration depth of superconducting indium alloys. Phys. Rev., 129(5):1952-1958, 1963.
[29] R. A. Connell. Parametric amplification in thin film superconducting transmission lines. Proc. IEEE, 51(4):616-617, 1963.
[30] R. Landauer. Parametric standing wave amplifiers. Proc. IRE, 48:1328-1329, 1960.
[31] Rolf W. Landauer. Superconductive parametric amplifier. U.S. Pat. No. 3,111,628, November 1963.
[32] A. S. Clorfeine. Microwave amplification with superconductors. Proc. IEEE, pages 844-845, 1964.
[33] A. S. Clorfeine. Nonlinear Reactance and Frequency Conversion in Superconducting Films at Millimeter Wavelengths. Applied Physics Letters, 4:131-132, April 1964.

[34] V. N. Gubankov, K. K. Likharev, and N. M. Margolin. Nonlinear microwave properties of thin superconducting films. JETP Lett.—USSR, 11(5):157, 1970.

[35] I. O. Kulik. Nonlinear high-frequency properties of thin superconducting films. Sov. Phys. JETP, 30(2):329-337, 1970.

[36] L. P. Gor'kov and N. B. Kopnin. Nonlinear electrodynamics of thin superconducting films. Soy. Phys. JETP, 32(1):128-133, 1971.

[37] N. I. Glushchuk, V. M. Dmitriev, and V. V. Onishchenko. Parametric effects in thin superconducting films. Radiotekhnika i Elektronika, 21:1707-1714, August 1976.

[38] M. E. Gershenzon and V. N. Gubankov. A superconducting-thin-film parametric amplifier. Radiotekhnika i Elektronika, 24:1097-1099, May 1979.

[39] H. Zimmer. Parametric amplification of microwaves in superconducting Josephson tunnel junctions. Appl. Phys. Lett., 10(7):193-195, 1967.

[40] P Russer. Parametric amplification with Josephson junctions. Archiv Elektr., 23(8):417, 1969.

[41] M. J. Feldman, P. T. Parrish, and R. Y. Chiao. Parametric amplification by unbiased Josephson junctions. J. Appl. Phys., 46(9):4031-4042, 1975.

[42] A. D. Smith, R. D. Sandell, J. F. Burch, and A. H. Silver. Low-noise microwave parametric amplifier. IEEE Trans. Magn., 21(2):1022-1028, 1985.

[43] B. Yurke, P. G. Kaminsky, R. E. Miller, E. A. Whittaker, and A. D. Smith. Observation of 4.2-K equilibrium-noise squeezing via a Josephson-parametric amplifier. Physical Review Letters, 60:764-767, February 1988.

[44] R. Moshovich, B. Yurke, P. G. Kaminsky, A. D. Smith, A. H. Silver, R. W. Simon, and M. V. Schneider. Observation of zero-point noise squeezing via a Josephson parametric amplifier. Phys. Rev. Lett., 65(12):1419-1422, Sep. 17 1990:

[45] M. Sweeny and R. Mahler. A travelling-wave parametric amplifier utilizing Josephson junctions. IEEE Trans. Magn., 21:654, March 1985.

[46] B. Yurke, M. L. Roukes, R. Movshovich, and A. N. Pargellis. A low-noise series-array Josephson junction parametric amplifier. Appl. Phys. Lett., 69:3078-3080, November 1996.

[47] D. H. Slichter, L. Spietz, O. Naaman, J. Aumentado, and I. Siddiqi. Progress towards a broadband traveling wave Josephson parametric amplifier. APS Meeting Abstracts, page 26009, March 2010.

[48] M. A. Castellanos-Beltran, K. D. Irwin, G. C. Hilton, L. R. Vale, and K. W. Lehnert. Amplification and squeezing of quantum noise with a tunable Josephson metamaterial. Nature Physics, 4:929-931, December 2008.

[49] S. M. Anlage, H. J. Snortland, and M. R. Beasley. A Current Controlled Variable Delay Superconducting Transmission-Line. IEEE Trans. Magn., 25(2):1388-1391, March 1989.

[50] B. Abdo, E. Segev, O. Shtempluck, and E. buks. Nonlinear dynamics in the resonance line shape of NbN superconducting resonators. Phys. Rev. B, 73:134513, 2006.

[51] J. E. Healey, T. Lindstrom, M. S. Colclough, C. M. Muirhead, and A. Ya. Tzalenchuk. Magnetic field tuning of coplanar waveguide resonators. Applied Physics Letters, 93(4), Jul. 28 2008.

[52] Erik A. Tholen, Adem Ergul, Evelyn M. Doherty, Frank M. Weber, Fabien Gregis, and David B. Haviland. Nonlinearities and parametric amplification in superconducting coplanar waveguide resonators. Appl. Phys. Lett., 90(25), Jun. 18 2007.

[53] P. K. Day, H. G. LeDuc, B. A. Mazin, A. Vayonakis, and J. Zmuidzinas. A broadband superconducting detector suitable for use in large arrays. Nature, 425(6960):817-821, 2003.

[54] J. Gao, J. Zmuidzinas, B. A. Mazin, P. K. Day, and H. G. Leduc. Experimental study of the kinetic inductance fraction of superconducting coplanar waveguide. Nuclear Instruments and Methods in Physics Research A, 559:585-587, April 2006.

[55] H. G. LeDuc, B. Bumble, P. K. Day, B. H. Eom, J. Gao, S. Golwala, B. A. Mazin, S. McHugh, A. Merrill, D. C. Moore, O. Noroozian, A. D. Turner, and J. Zmuidzinas. Titanium nitride films for ultrasensitive microresonator detectors. Appl. Phys. Lett., 97(10):102509, 2010.

[56] H. T. Su, Y. Wang, F. Huang, and M. J. Lancaster. Superconducting delay lines. J. Supercond. Nov. Magn., 21:7-16, 2008.

[57] J. Gao, M. Daal, A. Vayonakis, S. Kumar, J. Zmuidzinas, B. Sadoulet, B. A. Mazin, P. K. Day, and H. G. Leduc. Experimental evidence for a surface distribution of two level systems in superconducting lithographed microwave resonators. Appl. Phys. Lett., 92(15):152505, April 2008.

DEFINITIONS

Unless otherwise explicitly recited herein, any reference to an electronic signal or an electromagnetic signal (or their equivalents) is to be understood as referring to a non-volatile electronic signal or a non-volatile electromagnetic signal.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A traveling wave kinetic inductance parametric amplifier, comprising:
  a transmission line having at least one data signal input port, having at least one pump signal input port and having at least one data signal output port, said transmission line configured to provide a nonlinear interaction between a pump signal and a data signal that are present simultaneously in said transmission line, said transmission line comprises a superconducting material having a high kinetic inductance, and configured to provide superconducting behavior below a critical temperature and a critical current density; and a dispersion control element coupled to said transmission line and configured to control a dispersion relation of waves propagating on the transmission line, the combination of said transmission line and said dispersion control element providing the traveling wave kinetic inductance parametric amplifier.

2. The traveling wave kinetic inductance parametric amplifier of claim 1, wherein said superconducting material having the high kinetic inductance has a high normal state resistivity.

3. The traveling wave kinetic inductance parametric amplifier of claim 2, wherein said superconducting material having the high kinetic inductance comprises nitrogen (N) and a metal selected from the group consisting of titanium (Ti), niobium (Nb) and vanadium (V).

4. The traveling wave kinetic inductance parametric amplifier of claim 1, wherein said dispersion control element of said traveling wave kinetic inductance parametric amplifier is configured to control a gain.

5. The traveling wave kinetic inductance parametric amplifier of claim 4, wherein said dispersion control element provides negative dispersion.

6. The traveling wave kinetic inductance parametric amplifier of claim 1, wherein said dispersion is configured to be a function of frequency.

7. The traveling wave kinetic inductance parametric amplifier of claim 1, wherein said transmission line comprises a periodic variation of its structure along its length.

8. The traveling wave kinetic inductance parametric amplifier of claim 1, wherein said data signal comprises a frequency in the range of 0.1 to 1000 GHz.

9. The traveling wave kinetic inductance parametric amplifier of claim 1, configured to exhibit a gain bandwidth with a ratio of 1.6:1 or larger between an upper cutoff frequency and a lower cutoff frequency.

10. The traveling wave kinetic inductance parametric amplifier of claim 1, configured to exhibit a gain of 10 dB or greater.

11. The traveling wave kinetic inductance parametric amplifier of claim 1, configured to exhibit a noise temperature below 100 mK/GHz.

12. The traveling wave kinetic inductance parametric amplifier of claim 1, wherein said dispersion control element is a high-pass filter.

* * * * *